(12) United States Patent
Clemente et al.

(10) Patent No.: US 12,721,052 B2
(45) Date of Patent: Aug. 25, 2026

(54) SWITCH BASED ON A PHASE CHANGE MATERIAL

(71) Applicant: Commissariat à l'Énergie Atomique et aux Énergies Alternatives, Paris (FR)

(72) Inventors: Antonio Clemente, Grenoble Cedex (FR); Benoît Charbonnier, Grenoble Cedex (FR); Cécilia Dupre, Grenoble Cedex (FR); Bruno Reig, Grenoble Cedex (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 190 days.

(21) Appl. No.: 18/478,778

(22) Filed: Sep. 29, 2023

(65) Prior Publication Data

US 2024/0122083 A1 Apr. 11, 2024

(30) Foreign Application Priority Data

Oct. 7, 2022 (FR) ...................................... 2210292

(51) Int. Cl.
*G02F 1/29* (2006.01)
*H10N 70/00* (2023.01)
*H10N 70/20* (2023.01)

(52) U.S. Cl.
CPC ........... *H10N 70/257* (2023.02); *G02F 1/293* (2013.01); *H10N 70/231* (2023.02); *H10N 70/823* (2023.02)

(58) Field of Classification Search
CPC ..... H10N 70/257; H10N 70/823; G02F 1/293
See application file for complete search history.

(56) References Cited

U.S. PATENT DOCUMENTS

2005/0062561 A1 3/2005 Wyeth et al.
2012/0256104 A1 10/2012 Hase et al.
2016/0013549 A1* 1/2016 Schaffner ............ H01Q 21/065 343/724
2019/0187061 A1 6/2019 Han et al.

FOREIGN PATENT DOCUMENTS

JP 2011-033963 A 2/2011

OTHER PUBLICATIONS

English translation of JP2011-033963A (Year: 2011).*
FR2210292, Jun. 1, 2023, Preliminary Search Report.
Preliminary Search Report for French Application No. 2210292, dated Jun. 1, 2023.
Gharbieh et al., Phase change material based reconfigurable transmitarray: a feasibility study. 2022 16th European Conference on Antennas and Propagation (EuCAP). Mar. 27, 2022:1-4.

* cited by examiner

*Primary Examiner* — Sung H Pak

(57) ABSTRACT

A switch based on a phase change material including: a region in said phase change material that couples the first and second conductive electrodes of the switch; and a waveguide including a first end in line with a face of the region in said phase change material and a second end, opposed to the first end, designed to be illuminated by a laser source.

10 Claims, 3 Drawing Sheets

118
130
114
132
116
118

105b
C1
C2
140
112
142
140C
140P
116

LS
170
172
D2
C1
166
164b
164
160
140P
140C
150
162
D1

C3
140P
140C
160
164b
164
166
172
170
180
150
LS
182

SWITCH BASED ON A PHASE CHANGE MATERIAL

CROSS REFERENCE TO RELATED APPLICATIONS

This application claims priority to French application number 2210292, filed Oct. 7, 2022. The contents of which is incorporated by reference in its entirety.

TECHNICAL FIELD

The present disclosure relates generally to the field of electronic devices, and more specifically relates to reconfigurable electromagnetic surfaces. The present application relates more specifically to the field of transmitarray antennas and reflectarray antennas.

BACKGROUND ART

Among the various existing technologies of radiocommunication antennas, «transmitarray» radio antennas are known. These antennas generally comprise several elementary cells, each comprising a first antenna element irradiated by an electromagnetic field emitted by one or several sources, a second antenna element transmitting a modified signal toward the outside of the antenna and a coupling and phase shifting element between the first and second antenna elements.

Furthermore, radio antennas called «reflectarrays» are known. These antennas generally comprise several elementary cells, each comprising an antenna element irradiated by an electromagnetic field emitted by one or several sources, a reflecting element, for example a ground plane that reflects a modified signal toward the outside of the antenna and a coupling element between the antenna element and the reflecting element. Contrarily to the elementary cells of the transmitarray antennas, which transmit a radio signal to a direction opposite to the one or several sources that irradiate their first antenna element, the elementary cells of the reflectarray antennas reflect a radio signal toward the one or several sources that irradiate their antenna element.

For some applications, for example for satellite communication (SatCom) or for very high rate or very short range communication applications, for example at frequencies more than 80 GHz, it is desirable to have reconfigurable transmitarray antennas and reflectarray antennas that make it possible to dynamically change the phase of the radiated wave.

SUMMARY OF INVENTION

There is a need to improve the existing transmitarray antennas and reflectarray antennas.

One embodiment addresses all or some of the drawbacks of known transmitarray antennas and reflectarray antennas. A purpose of an embodiment is more specifically to allow a phase electronic control, for example in a frequency range between 80 and 350 GHz, corresponding to millimetric wavelengths, and to have switches available, whose polarization leads to a reduction of electric consumption.

To do so, an embodiment provides a switch based on a phase change material comprising:

- a region in said phase change material that couples the first and second conductive electrodes of the switch; and
- a waveguide comprising a first end in line with a face of the region in said phase change material and a second end, opposed to the first end, designed to be illuminated by a laser source.

According to an embodiment, the waveguide comprises a central region made of silicon nitride, surrounded by a peripheral region made of silicon dioxide.

According to an embodiment, the phase change material is a chalcogenide material.

According to an embodiment, the first and second conductive electrodes are parts of an antenna element of a cell of a transmitarray or of a reflectarray.

According to an embodiment, the first and second conductive electrodes are on and in contact with a face of a substrate.

According to an embodiment, the first and second conductive electrodes are on and in contact with a face of a dielectric layer coating a substrate.

According to an embodiment, at least one end, among the first and second ends of the waveguide, makes it possible to transmit or receive a radiation in a direction orthogonal to the direction of propagation of the radiation through the waveguide.

According to an embodiment, said end of the waveguide has a tapered shape.

According to an embodiment, at least one end, among the first and second ends of the waveguide, makes it possible to transmit or receive a radiation in a direction parallel to the direction of propagation of the radiation through the waveguide.

Another embodiment provides a cell of a transmitarray or of a reflectarray comprising at least one switch as described above.

Another embodiment provides a transmitarray or a reflectarray comprising:

- a plurality of cells as defined above;
- one or several laser sources; and
- a control circuit for the one or several laser sources.

According to an embodiment, each laser source is part of the same chip as of each switch it is associated to.

According to an embodiment, each laser source is part of a chip different from the one of each switch it is associated to, wherein the laser source is coupled to the waveguide of said switch through an optical fiber.

Another embodiment provides an antenna comprising a transmitarray or a reflectarray as described above and at least one source configured to irradiate a face of the array.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the present disclosure describes hereafter embodiments of a cell for a transmitarray and embodiments of a cell for a reflectarray. However, the structure and the functioning of the one or several primary sources of the antenna, designed to irradiate the transmitarray or the reflectarray, are not detailed, since the described embodiments are compatible with all or most known primary radiation sources for transmitarray or reflectarray. For example, each primary source is designed to produce a generally tapered beam that irradiates all or a part of the transmitarray or of the reflectarray in near-field or far-field condition. For example, each primary source comprises a horn antenna. For example, the central axis of each primary source is substantially orthogonal to the average plane of the array or in an offset configuration (offset from the central axis and turned so that it illuminates the surface of the reflectarray). This illumination is typical in the case of a reflectarray to reduce the blocking.

Furthermore, the manufacturing processes of the described transmitarrays and reflectarrays are not detailed, since the manufacture of the described structures are known from the person skilled in the art, starting from the specifications of the present disclosure.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figures 1, 2, 3:
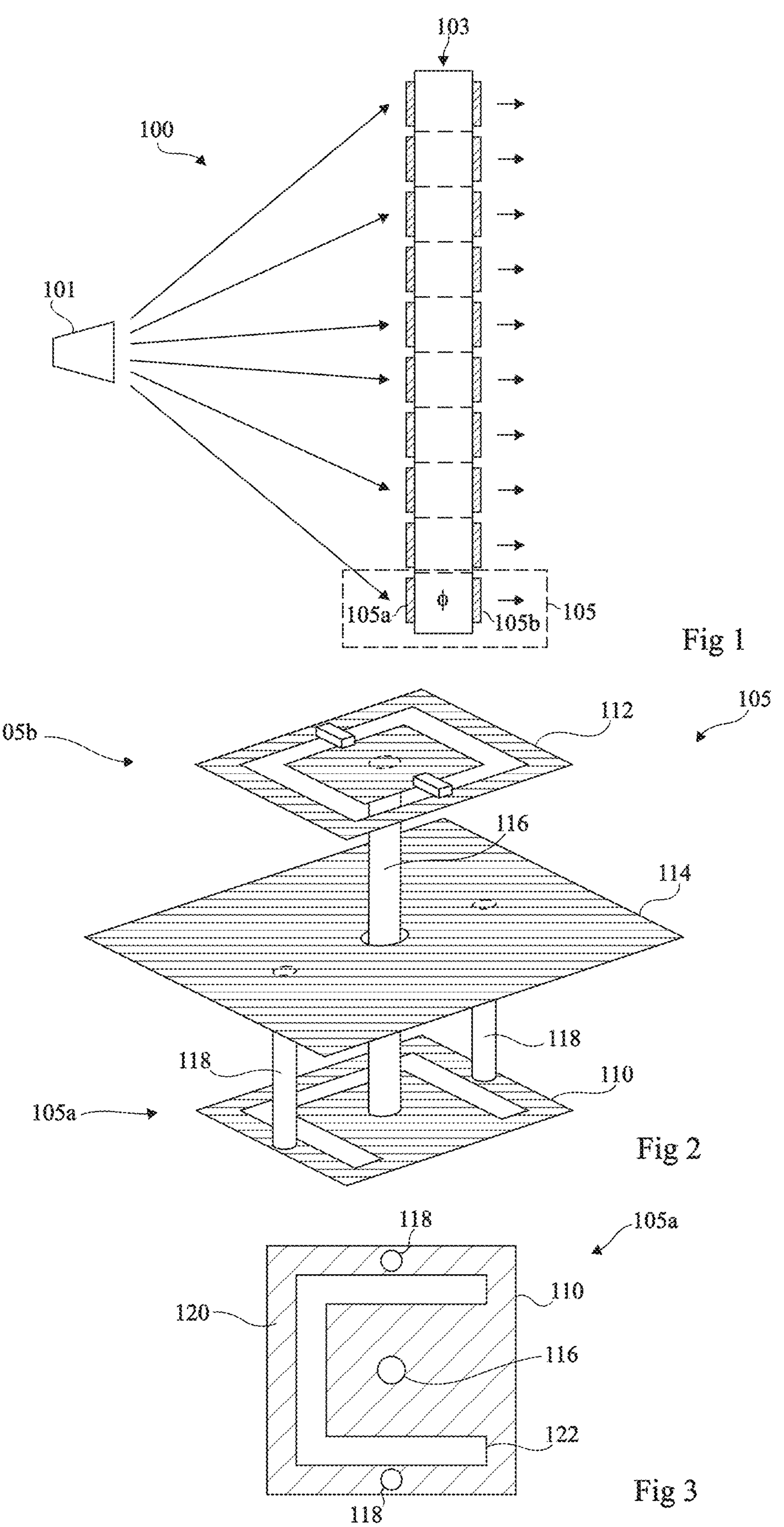
FIG. 1 is a schematic and partial side view, for example of a transmitarray of the type to which some described embodiments apply.
FIG. 2 is a schematic and partial perspective view of an elementary cell of the transmitarray of FIG. 1 according to an embodiment.
FIG. 3 is a schematic and partial view from above of a first antenna element of the elementary cell of FIG. 2.

FIG. 1 is a schematic and partial side view, of an example of a transmitarray antenna 100, for example of the type to which some described embodiments apply.

The antenna 100 typically comprises one or several primary sources 101 (one unique source 101 in the illustrated example) that irradiates a transmitarray 103. The source 101 can have any polarization, for example linear or circular. The array 103 comprises a plurality of elementary cells 105, for example arranged as a matrix in rows and columns. Each cell 105 typically comprises a first antenna element **105*a* located on a first face of the array 103 in line with the primary source 101, and a second antenna element 105*b* located on a second face of the array 103 opposed to the first face. The second face of the array 103 is, for example, turned toward an emission medium of the antenna 100**.

In emission mode, each cell 105 is able to receive an electromagnetic radiation at its first antenna element **105*a* and to reemit this radiation from its second antenna element 105*b*, for example by introducing a known phase shift 4. In reception mode, each cell 105 is able to receive an electromagnetic radiation at its second antenna element 105*b* and to reemit this radiation from its first antenna element 105*a* toward the source 101 with the same phase shift 4. The radiation re-emitted by the first antenna element 105*a* is, for example, focalized onto the source 101**.

The characteristics of the beam from the antenna 100, notably its shape (or size) and its direction of maximal emission (or pointing direction) depend on phase shift values respectively produced by the various cells 105 of the array 103.

The transmitarray have the advantage, among others, to have good energetic efficiency and to be relatively simple, inexpensive and compact. This comes from the fact that transmitarray antennas can be manufactured planar, generally on a printed circuit.

This disclosure more specifically focuses on reconfigurable transmitarray antennas 103. The transmitarray 103 is said reconfigurable when the elementary cells 105 can be individually electronically controlled to change the value of the phase shift (I), which makes it possible to dynamically change the characteristics of the beam that the antenna generates, in particular to change its pointing direction without mechanically moving the antenna or a part thereof with a motor driven element.

FIG. 2 is a schematic and partial perspective view of an elementary cell 105 of the transmitarray 103 of the antenna 100 of FIG. 1 according to an embodiment.

According to this embodiment, the first antenna element **105*a* of the elementary cell 105 comprises a patch antenna 110 designed to capture the electromagnetic radiations emitted from the source 101 and the second antenna element 105*b* comprises another patch antenna 112 designed to emit a phase shifted signal out from the antenna 100. In the example above, the elementary cell 105 further comprises a ground plane 114 between the patch antennas 110 and 112**.

For example, the antenna 110, the ground plane 114 and the antenna 112 are respectively manufactured in three successive stacked metallization levels separated from each other by dielectric layers, for example made of quartz. For example, the ground plane 114 is separated from each of the antennas 110 and 112 by ca. 200 μm of dielectric material.

In the pictured example, a central conductive via 116 couples the antenna 110 to the antenna 112. More specifically, as pictured in FIG. 2, the via 116 has a lower end in contact with the upper face of the antenna 110 and an upper end in contact with a lower face of the antenna 112. The central conductive via 116 is electrically isolated from the ground plane 114. In the pictured example, the ground plane 114 comprises a circular hole with a diameter larger than the via 116, which allows the via 116 to cross the ground plane 114 without any contact of the via 116 with the ground plane 114. For example, the central conductive via 116 has a diameter equal to ca. 80 μm.

In addition, in this example, lateral conductive vias 118 on both sides of the central conductive via 116 couple the antenna 110 to the ground plane 114. More specifically, as pictured in FIG. 2, each via 118 has a lower end in contact with the upper face of the antenna 110 and an upper end in contact with a lower face of the antenna 114. As a variant, in the case of an optical command, these vias can be omitted, since there is no tension to control.

FIG. 3 is a schematic and partial view from above of the first antenna element 105*a* of the elementary cell 105 of FIG. 2. FIG. 3 more specifically illustrates the patch antenna 110 of the elementary cell 105.

In the pictured example, the patch antenna 110 comprises a substantially square conductive plane 120 with a U-shaped slit 122 or groove. For example, the slit 122 is substantially centered with respect to the conductive plane 120. In this example, the central conductive via 116 is in contact with a zone of the conductive plane 120 between the two branches of the U-shaped slit 122. For example, the via 116 is substantially centered with respect to the conductive plane 120.

In addition, in the example pictured in FIG. 3, the lateral conductive vias 118 are located on both sides of the slit 122. More specifically, for example, each via 118 is connected to a zone of the conductive plane 120 located outside of the U-shaped slit 122 and along one of the vertical branches of the U. In other words, in this example, the zone of the conductive plane 120 where each lateral via 118 is connected is separated from the zone of the conductive plane 120 where the central via 116 is connected by one of the vertical branches of the U-shaped slit 122. As a variant again, in the case of an optical command, these vias can be omitted, since there is no tension to control.

For example, the side of the square made of the conductive plane 120 is ca. 0.44 mm long, the vertical branches and the horizontal branch of the U-shaped slit 122 are all ca. 0.32 mm long, and the slit 122 is ca. 50 μm wide.

Figures 4, 5, 6, 7:
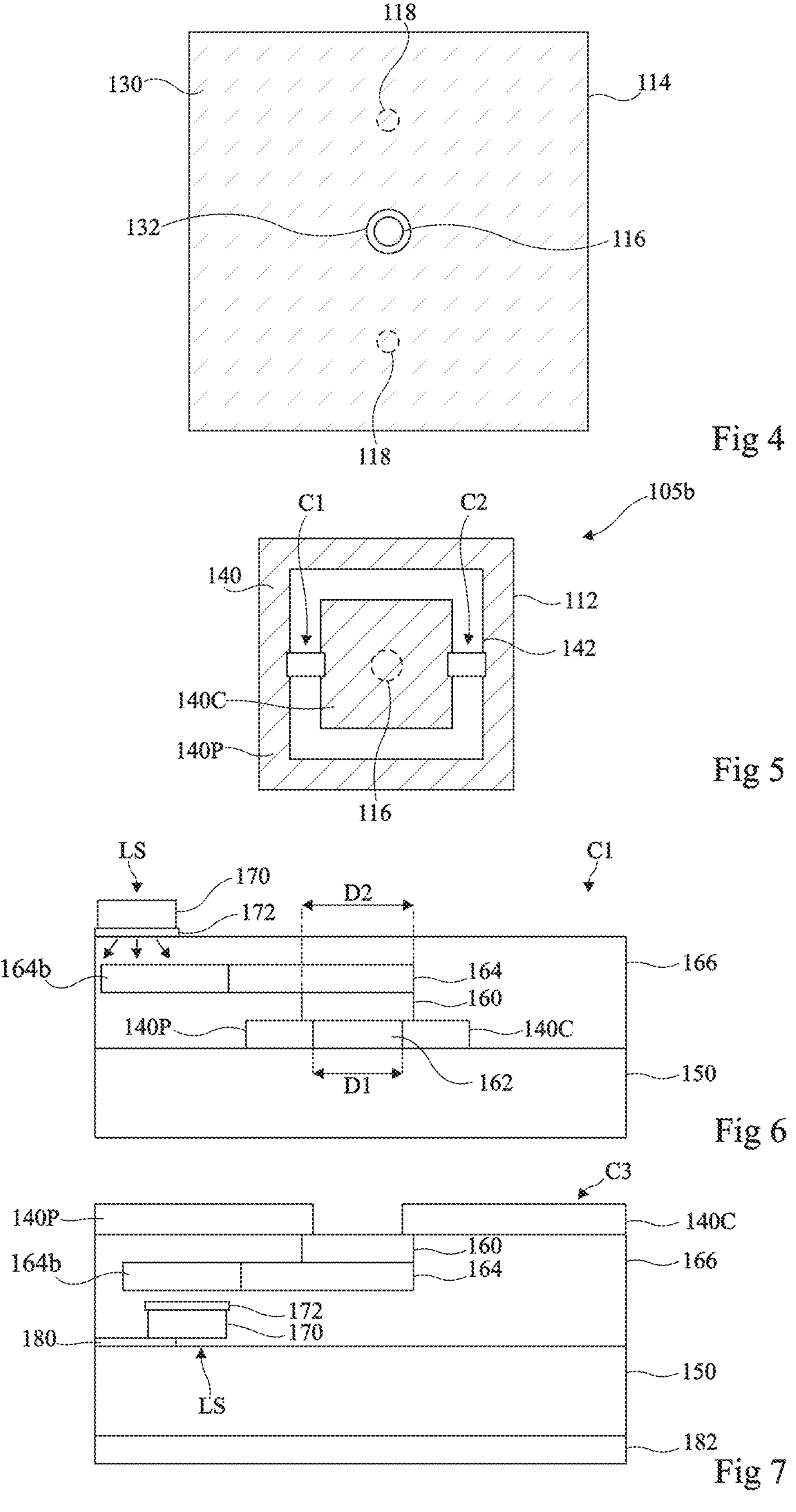
FIG. 4 is a schematic and partial view from above of a part of the elementary cell of FIG. 2.
FIG. 5 is a schematic and partial view from above of a second antenna element of the elementary cell of FIG. 2.
FIG. 6 is a schematic and partial cross-sectional view of a switch based on a phase change material with an integrated optical command according to an embodiment.
FIG. 7 is a schematic and partial cross-sectional view of another switch based on a phase change material with an integrated optical command according to an embodiment.

FIG. 4 is a schematic and partial view from above of a part of the elementary cell 105 of FIG. 2. More specifically, FIG. 4 illustrates the ground plane 114 between the first and second antenna elements 105*a*, 105*b*.

In the pictured example, the ground plane 114 comprises a substantially square conducting plane 130. In this example, the central conductive via 116 crosses approximatively the center of the ground plane 114. The via 116 is isolated from the conductive plane 130 by a circular or crown-shaped hole 132 through the conductive plane 130 around the via 116. For example, the side of the square made of the conductive plane 130 is ca. 1 mm long.

In this example, the side of the square made of the conductive plane 130 substantially defines the outer dimensions of the elementary cell 105 of the transmitarray 103.

The ground plane 114 works as an electromagnetic shielding between the antenna 110 and the antenna 112 of the cell 105.

In the example illustrated in FIG. 4, the lateral conductive vias 118 are in contact with the lower face of the conductive plane 130 in diametrically opposed zones with respect to the central conductive via 116. In this example, the vias 116 and 118 are located on a same line parallel to one of the sides of the conductive plane 130. In addition, the vias 118 are equally far away from the via 116. As a variant again, in the case of an optical command, these vias can be omitted, since there is no tension to control.

FIG. 5 is a schematic and partial view from above of the second antenna element 105*b* of the elementary cell 105 of FIG. 2. FIG. 5 more specifically illustrates the patch antenna 112 of the elementary cell 105.

In the pictured example, the antenna 112 comprises a four-sided conductive plane 140. For example, the conductive plane 140 is more accurately rectangular or, as in the example of FIG. 5, substantially square-shaped.

In the illustrated example, the conductive plane 140 comprises an opening 142 that separates a central region 140C of the conductive plane 140 from a peripheral region 140P of the conductive plane 140. In this example, the opening 142 has a substantially annular shape, for example a rectangular or square ring shape.

In the illustrated example, the central conductive via 116 is in contact with the central region 140C of the conductive plane 140. More accurately, in this example, the upper end of the via 116 is substantially coupled to the middle of a lower face of the region 140C. For example, the central region 140C of the conductive plane 140, which is laterally delineated by the annular opening 142, is an input terminal of the antenna 112.

The antenna 112 further comprises a first switching element C1 and a second switching element C2 that each couple the central region 140C to the peripheral region 140P of the conductive plane 140. More accurately, in the example illustrated in FIG. 5, the first and second switching elements C1 and C2 are in contact with the peripheral region 140P in diametrically opposed zones with respect to the central conductive via 116. In this example, the switching elements C1 and C2 and the conductive via 116 are located on a same line parallel to one of the sides of the conductive plane 140. In this example, the switch C1 is located substantially vertical to the horizontal branch of the U-shaped slit 122.

The switching elements C1 and C2 are controlled in opposition, which means so that if one of the switches C1, C2 is on, the other switch C2, C1 is off. This allows the second antenna element 105*b* of the elementary cell 105 to switch between two phase states $\phi$, substantially equal to 0° and 180° in this example. The 0° and 180° phase states respectively correspond to the case where the switch C1 is off while the switch C2 is on, and to the case where the switch C1 is on while the switch C2 is off.

For example, the side of the square made of the conductive plane 140 is ca. 0.44 mm long, the sides of the square annular opening 142 are both ca. 0.32 mm long, and the slit 142 is ca. 50 μm wide.

FIG. 6 is a schematic and partial cross-sectional view of the switch C1 of the second antenna element 105*b* of the FIG. 5.

According to an embodiment, the switching element C1, or switch, is made of a phase change material. Phase change materials are materials that can switch, under the effect of heat, between a crystalline phase and an amorphous phase, wherein the amorphous phase has an electric resistance higher than that of the crystalline phase. It is possible to take advantage of this phenomenon to manufacture, like for the second antenna element 105*b*, switches with an off state (amorphous phase) and an on state (crystalline phase) with a different resistance through the phase change material.

In the example illustrated in FIG. 6, a continuous region 160 made of a phase change material is located on and in contact with the upper faces of the central regions 140C and peripheral 140P of the conductive plane 140. In this example, the regions 140C and 140P are disjoint and separated from each other by a distance D1 of ca. 1 μm. For example, the regions 140C and 140P are on and in contact with a face of a substrate 150 (the upper face of the substrate 150 as per the FIG. 6). For example, the substrate 150 is a wafer or a piece of wafer made of a transparent material, for example made of glass or of a semiconductor material, for example standard or highly resistive, for example silicon.

In the illustrated example, a dielectric region 162, for example made of silicon dioxide, laterally separates the central region 140C from the peripheral region 140P of the conductive plane 140. For example, the region 162 has a thickness substantially equal to that of the conductive plane 140, for example equal to ca. 0.6 μm, and extends laterally between the regions 140C and 140P on and in contact with the upper face of the substrate 150. Although it is not detailed in FIG. 6, other dielectric regions coplanar to the region 162 can further extend laterally between the regions 140C and 140P and out of the region 140P. For example, the regions 140C and 140P can practically be manufactured in a same electrically conductive layer.

The region 160 made of a phase change material totally coats the upper face of the dielectric region 162 and extends laterally on and in contact with parts of the upper faces of the regions 140C and 140P next to the region 162. For example, the regions 140C and 140P correspond to first and second electrodes of the switch C1 that are coupled by the region 160 made of a phase change material. For example, the region 160, viewed from above, has a substantially rectangular shape with a width D2 (FIG. 6) equal to ca. 3 μm and a length equal to ca. 20 μm (as measured along a direction orthogonal to the sectional plan of FIG. 6).

For example, the region 160 is made of a «chalcogenide» material, which means a material or an alloy comprising at least one chalcogenide element, for example a material of the type of germanium telluride (GeTe) or germanium-antimony-tellurium (GeSbTe, also called «GST»).

According to an embodiment, the switch C1 further comprises a waveguide 164 comprising a first end in line with a face of the region 160 in a phase change material and a second end, opposed to the first end, designed to be illuminated by a laser source LS. More accurately, in the illustrated example, the waveguide 164 coats the upper face of the region 160 and extends laterally to the laser source LS. However, the described embodiments do not restrict to this specific configuration. More generally, an optical coupler can be provided between the waveguide 164 and the region 160, wherein the position of the waveguide relative to the region 160 depends on the design of the coupler. The waveguide 164 is an «optical» waveguide designed to transmit the radiations emitted from the laser source LS to the phase change material of the region 160. For example, the waveguide 164 comprises a central region, or core, made of silicon nitride. The material is selected to get an index contrast that makes it possible to confine and guide the optical mode.

In the example illustrated in FIG. 6, the structure on the upper face of the substrate 150, comprising the regions 140P, 140C, 160 and 162 and the waveguide 164, is coated with a dielectric layer 166. In this example, the layer 166 coats the upper face and the sides of the waveguide 164, and a part of the lower face of the waveguide 164 that is not in contact with the region 160. The layer 166 is a peripheral region that surrounds the central region of the waveguide 164. For example, the material of the layer 166 has an optical index lower than that of the central region of the waveguide 164 and does not absorb the optical wave. For example, the layer 166 is made of silicon dioxide.

For example, the waveguide 164 and the layer 166 are manufactured in isolating thin layers used to manufacture the antenna element 105*b* of the cell 105. This advantageously avoids the implementation of additional manufacturing steps to create the waveguide 164 surrounded by the layer 166.

For example, at the end designed for illumination by the laser source LS, the waveguide 164 comprises an input coupling element 164*b*, also called input surface or input structure of the waveguide 164. At the end located in line with the region 160 made of a phase change material, the waveguide 164 can further comprise an output coupling element (not illustrated in the figure), also called output surface or output structure of the waveguide 164. The input coupling element 164*b* can include a structure, for example a diffraction grating with a Bragg structure or any other coupling structure that makes it possible to capture the radiations from the laser source LS and to transmit these radiations to the output surface. The laser LS can emit a light wave vertically at the surface of the substrate. In this case, a coupling grating makes it possible to lead the wave through the waveguide, for example as described in the paper «Enabling VCSEL-on-silicon nitride photonic integrated circuits with micro-transfer-printing», J. Goyvaerts et al., Optica 2021, https://doi.org/10.1364OPTICA.441636//. As a variant, the laser LS can emit a light wave lengthwise (parallel to the surface of the substrate). In this case, an adiabatic coupler can lead the light into the waveguide 164, for example such as described in the paper «Heterogeneous III-V on silicon nitride amplifiers and lasers via microtransfer printing», C. Op de Beeck https://doi.org/10.1364/OPTICA.382989//.

In addition, the output surface of the waveguide 164 can have a structure that makes it possible to reemit the transmitted radiations from the input surface to the region 160 made of phase change material. Although it has not been detailed in FIG. 6, the output surface of the waveguide 164 can have a structure identical or analogous to that of the input surface of the waveguide 164.

As a rule, in the illustrated example, the input and output surfaces respectively make it possible to receive and transmit a radiation in a direction orthogonal to the direction of propagation of the radiation through the waveguide 164. As a variant, at least one surface among the input and output surfaces of the waveguide 164 can have a structure that respectively makes it possible to receive and transmit a radiation in a direction parallel to the direction of propagation of the radiation through the waveguide 164.

In the illustrated example, the laser source LS comprises an active region 170 or emissive region, designed to emit a laser beam. In this example, an interface layer 172 on and in contact with the layer 166 is lain between the layer 166 and the region 170. For example, the active region 170 of the laser source LS is made of krypton fluoride (KrF). As a variant, the region 170 can be made of a semiconductor material III-V.

For example, the laser source LS can be positioned onto the layer 166 thanks to a technique called flip chip, for example thanks to a metal-metal bonding, for example by performing a process such as described in the publication by Y. Wang et al. called «Vertical-cavity surface-emitting laser flip-chip bonding to silicon photonics chip». As a variant, the laser source LS can be manufactured by a process called transfer printing, for example such as described in the publication by C. Op de Beeck et al. called «Heterogeneous III-V on silicon nitride amplifiers and lasers via microtransfer printing», or by a process of direct bonding, for example such as described in the publication by J. M. Ramirez et al.

called «Low-Threshold, High-Power On-Chip Tunable III-V/Si Lasers with Integrated Semiconductor Optical Amplifiers».

As a variant, the laser source LS can be manufactured on another support independent from this substrate. In this case, the emitted optical mode will be focalized into the waveguide by coupling on the surface of the wafer using a coupling grating or on the edge of the wafer (butt coupling).

For example, to commute the switch C1 from off to on, the region 160 is heated thanks to the laser source LS through the waveguide 164 to a temperature T1 for a duration d1. The temperature T1 and the duration d1 are selected so that they initiate a phase change of the material in the region 160 from the amorphous phase to the crystalline phase. For example, the temperature T1 is higher than a crystallization temperature and lower than a melting temperature of the phase change material, and the duration d1 is between 10 and 100 ns.

Conversely, to commute the switch C1 from on to off, for example, the region 160 is heated thanks to the laser source LS through the waveguide 164 to a temperature T2 higher than the temperature T1 for a duration d2 shorter than the duration d1. The temperature T2 and the duration d2 are selected so that they initiate a phase change of the material in the region 160 from the crystalline phase to the amorphous phase. For example, the temperature T2 is higher than the melting temperature of the phase change material, and the duration d2 is ca. 10 ns.

For example, in a case where the laser source LS is made of krypton fluoride, a radiation with a wavelength ca. 248 nm is emitted by the laser source LS, for example as pulses, to initiate transitions of the material of the region 160 between the amorphous and crystalline phases. For example, a pulse with a fluence of ca. 85 $mJ \cdot cm^{-2}$ is used to get a transition of the material in the region 160 from the amorphous phase to the crystalline phase. In addition, for example, another pulse with a fluence of ca. 185 $mJ \cdot cm^{-2}$ is used to get a transition of the material in the region 160 from the crystalline phase to the amorphous phase.

For example, the switch C2 has analogous structures, dimensions and functioning as what was previously described with respect to the switch C1.

Using the laser source LS associated with the waveguide 164 to control the switches C1 and C2 of the antenna element 105*b* has the advantage of reducing the number of control electric conductive lines. Contrarily to switches made of a phase change material, for example controlled by direct heating, for example by circulation of a current through the phase change material, or by indirect heating, for example by circulation of a current through a heating element isolated from the phase change material, for which two control lines are used, one to apply the control voltage, the other to apply the reference voltage, only one waveguide 164 is used to control the commutation of each switch C1, C2.

Another advantage of the switches C1 and C2 is that they have a capacitance $C_{off}$ at the off state that is lower than that of the usual indirect heating switches, which typically comprise a heating element made of an electrically conductive material, for example made of a metal, electrically isolated from the phase change material.

In the transmitarray 103, for example, it is possible to use a different laser source LS to control each switch C1, C2 of each second antenna element 105*b*, wherein the emission of the laser sources LS of the transmitarray 103 is controlled by a control circuit (not illustrated). As a variant, it is possible to use a same laser source LS to control several switches C1, C2 of the second antenna elements 105*b* of the transmitarray 103. In this case, for example, each second antenna element 105*b* can be associated to an optical switch to control the switches C1 and C2 in opposition of phase or to a «1 to N» type multiplexer, wherein N is an integer not less than three, designed to control several switches C1, C2 of several second antenna elements 105*b*.

An advantage of the switches C1 and C2 made of a phase change material is that they can work at power levels at least as high as the usual switches of elementary cells of reconfigurable transmitarray or reflectarray antennas, while maintaining a better linearity. In addition, the switches C1 and C2 have an excellent stability within the terahertz frequency ranges.

In addition, the transmitarray 103 that comprises cells 105 comprising the switches C1 and C2 has advantageously a lower power consumption than the current transmittarrays comprising, for example, such components as p-i-n diodes or varactor diodes.

FIG. 7 is a schematic and partial cross-sectional view of another switch C3 based on a phase change material according to an embodiment.

The switch C3 of FIG. 7 comprises common elements with the switch C1 of FIG. 6. These common elements won't be detailed hereafter again. The switch C3 of FIG. 7 is different from the switch C1 of FIG. 6 in that, in the switch C3 of FIG. 7, the structure comprising the laser source LS, the layer 166, the waveguide 164 and the regions 140P, 140C, 160 and 162, compared to the switch C1 of FIG. 6, is turned with respect to the upper face of the substrate 150. For example, the example illustrated in FIG. 7 corresponds to a case where the switch C3 made of a phase change material is manufactured on a «functionalized» substrate.

More specifically, in the example illustrated in FIG. 7, the regions 140P and 140C are on and in contact with the upper face of the dielectric layer 166, which means the face of the layer 166 opposed to the substrate 150. The region 160 in phase change material is under and in contact with the regions 140P and 140C above. In addition, the waveguide 164 is in contact with the region 160 through a part of its upper face. In the illustrated example, the active region 170 of the laser source LS is on and in contact with an underlying electrically conductive region 180 located on and in contact with the upper face of the substrate 150. For example, the region 180 makes it possible to polarize the active region 170 of the laser source LS to initiate its emission. In this example, an electrically conductive layer 182 coats the lower face of the substrate 150.

Although it is not illustrated in FIG. 7, electrically conductive vias can be provided in the structure of the switch C3, which make it possible to couple respectively the interface layer 172 and the region 180 to conductive tracks located on the side of the electrodes 140P and 140C, for example manufactured in the conductive plane 140.

The switch C3 of FIG. 7 works similarly as the switch C1 of FIG. 6 and provides similar advantages. For example, each switch C1, C2 of the second antenna element 105*b* can be replaced by a switch with a structure identical or similar to that of the switch C3. In addition, although not illustrated, it can be provided that each cell 105 of the transmitarray 103 comprises one or several switches identical or analogous to the switch C1, C2 or C3.

In the examples described above in relationship with FIGS. 6 and 7, the laser source LS is of «integrated» type, which means that it takes part of a same chip as the one or several switches it is associated with. As a variant, a not integrated laser source LS can be provided, which means manufactured on a chip different from the one or several switches it is associated with. Then, the laser source LS is, for example, coupled to the waveguide of each switch it is associated with through an optical link, for example an optical fiber.

Figure 8:
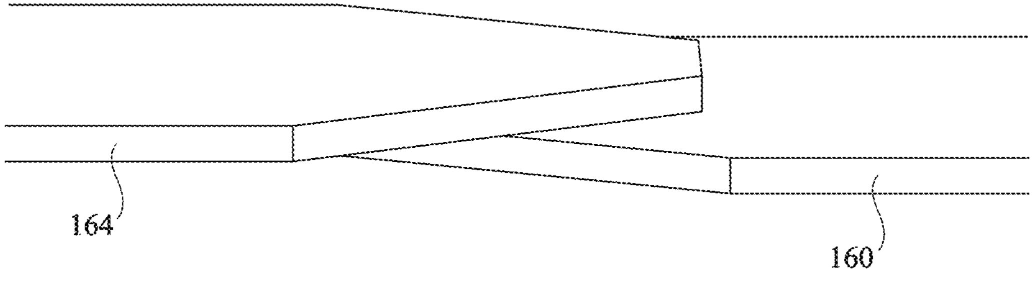
FIG. 8 is a perspective view of an output surface of a waveguide according to an embodiment.

FIG. 8 is a perspective view of an output surface of a waveguide 164 according to an embodiment.

In the illustrated example, the waveguide 164 is stacked on the region 160 made of phase change material. More accurately, in this example, a face of the waveguide 164 (the lower face of the waveguide 164 as per the orientation of the FIG. 8) is on and in contact with a face of the region 160 made of phase change material (the upper face of the region 160 as per the orientation of the FIG. 8). The output surface of the waveguide 164 has, for example, a tapered shape that gets narrower near to the region 160 made of phase change material. Similarly, the region 160 made of phase change material, like the illustrated example, can have a tapered shape that gets narrower near to the waveguide 164. In this example, the waveguide 164 and the region 160 in a phase change material have an «adiabatic» coupling.

Figure 9:
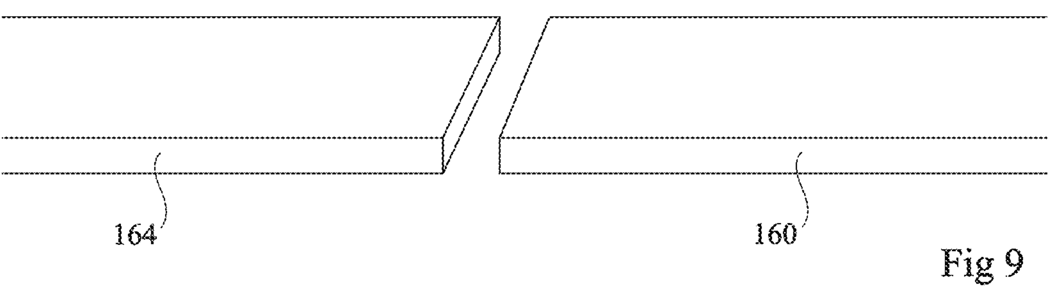
FIG. 9 is a perspective view of an output surface of a waveguide according to another embodiment.

FIG. 9 is a perspective view of an output surface of a waveguide according to another embodiment.

In the illustrated example, the waveguide 164 and the region 160 made of phase change material are substantially coplanar. In the illustrated example, the output surface of the waveguide 164 comprises, for example, a face of the waveguide 164 in line with the region 160 in a phase change material, wherein said faces are substantially parallel to each other and orthogonal to a direction of propagation of light through the waveguide 164. In this example, the waveguide 164 and the region 160 in phase change material have a butt coupling.

Although FIGS. 8 and 9 illustrate embodiments of the output surface of the waveguide 164, a structure identical or analogous to that of FIG. 8 or of FIG. 9 can be provided at the input surface of the waveguide 164 for the optical coupling between the laser source LS and the waveguide 164.

Although application examples for transmitarray antennas have been described in relationship with FIGS. 1 to 9, the people skilled in the art can transpose the described embodiments to applications using reflectarray antennas. Such antennas typically comprise one or several primary sources that irradiate a reflectarray comprising a plurality of elementary cells, for example arranged as a matrix in rows and columns, wherein each cell typically comprises an antenna element located on a first face of the array in line with the primary source and turned toward the emission medium of the antenna, and a reflecting element located on a second face of the array opposed to the first face.

Various embodiments and variants have been described. Those skilled in the art will understand that certain features of these embodiments can be combined and other variants will readily occur to those skilled in the art. In particular, it is possible to adapt the shape of the antenna element 105*a* according to the polarization of the associated source 101.

In addition, although an example of elementary cell 105 is described with two switches made of a phase change material C1 and C2, the person skilled in the art can adapt the described embodiments to any number of switches made of a phase change material. For example, it could be provided more than two switches made of a phase change material in a case of a reconfigurable elementary cell with more than two different phase states.

Furthermore, although above is described an applicative example to transmitarray or reflectarray antennas, the switches made of phase change material with an optical command as described in relationship with FIGS. 6 and 7 can have other applications. More generally, such switches can be used in any application that may benefit fewer tracks of electrical connection to control a switch. For example, such switches can be integrated to filters, phase shifting circuits, etc. and more generally to any type of application that uses a switch.

Finally, the practical implementation of the embodiments and variants described herein is within the capabilities of those skilled in the art based on the functional description provided hereinabove.

The invention claimed is:

1. A transmitarray cell or a reflectarray cell including a switch based on a phase change material comprising:

a region in said phase change material that couples the first and second conductive electrodes of the switch; and a waveguide comprising a first end in line with a face of the region in said phase change material and a second end, opposed to the first end, designed to be illuminated by a laser source, wherein the waveguide further comprises, on the side of its second and first ends, input and output surfaces that respectively make it possible to receive and transmit a radiation in a direction orthogonal to the direction of propagation of the radiation through the waveguide;

wherein the first and second conductive electrodes are parts of an antenna element of a cell of a transmitarray or of a reflectarray.

2. A switch according to claim 1, wherein the waveguide comprises a central region made of silicon nitride, surrounded by a peripheral region made of silicon dioxide.

3. A switch according to claim 1, wherein said phase change material is a chalcogenide material.

4. A switch according to claim 1, wherein the first and second conductive electrodes are on and in contact with a face of a substrate.

5. A switch according to claim 1, wherein the first and second conductive electrodes are on and in contact with a face of a dielectric layer coating a substrate.

6. A switch according to claim 1, wherein at least one end among the first and second ends of the waveguide has a tapered shape.

7. A transmitarray or a reflectarray comprising:

a plurality of cells according to claim 1;

one or several laser sources; and a control circuit for the one or several laser sources.

8. An array according to claim 7, wherein each laser source is part of a same chip as of each switch it is associated to.

9. An array according to claim 7, wherein each laser source is part of a chip different from the one of each switch it is associated to, wherein the laser source is coupled to the waveguide of said switch through an optical fiber.

10. An antenna comprising a transmitarray or a reflectarray according to claim 7 and at least one source configured to irradiate a face of the array.

* * * * *